United States Patent
Kim et al.

(10) Patent No.: US 6,928,719 B2
(45) Date of Patent: Aug. 16, 2005

(54) METHOD FOR FABRICATING SURFACE ACOUSTIC WAVE FILTER PACKAGE

(75) Inventors: Tae Hoon Kim, Kyungki-do (KR); Chan Wang Park, Seoul (KR); Joo Hun Park, Kyungki-do (KR); Jong Tae Kim, Kyungki-do (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 525 days.

(21) Appl. No.: 10/119,708

(22) Filed: Apr. 11, 2002

(65) Prior Publication Data

US 2003/0009864 A1 Jan. 16, 2003

(30) Foreign Application Priority Data

Dec. 7, 2001 (KR) .......................................... 2001-77277

(51) Int. Cl.$^7$ .......................... H04R 31/00; H05K 3/28
(52) U.S. Cl. ........................ 29/594; 29/25.35; 29/832; 29/841; 438/108; 438/112; 438/121; 174/52.4; 361/730; 361/816; 427/427.1; 264/272.11
(58) Field of Search .................. 29/832, 841, 594, 29/25.35; 438/106, 108, 112, 121, 125; 174/52.2, 52.4; 361/730, 765, 816, 820; 427/421.1, 427.1; 264/272.11, 272.14, 272.17

(56) References Cited

U.S. PATENT DOCUMENTS

| 5,223,739 | A | * | 6/1993 | Katsumata et al. ..... 361/820 X |
| 5,737,191 | A | * | 4/1998 | Horiuchi et al. ....... 174/52.2 X |
| 6,329,739 | B1 | | 12/2001 | Sawano |
| 6,492,194 | B1 | * | 12/2002 | Bureau et al. .............. 438/106 |

FOREIGN PATENT DOCUMENTS

| EP | 1 313 217 | | 5/2003 |
| JP | 11-150440 | | 6/1999 |
| JP | 58-137235 | * | 11/2004 ............... 29/832 X |
| KR | 2001-0042496 | | 5/2001 |

* cited by examiner

Primary Examiner—A. Dexter Tugbang
(74) Attorney, Agent, or Firm—Lowe Hauptman & Berner, LLP

(57) ABSTRACT

A method for fabricating a surface acoustic wave filter chip package includes: mounting a surface acoustic wave filter chip on a substrate; forming a underfill in a space between the substrate and the chip; forming a metal shield layer on a whole outer wall of the chip by using a spray process; and molding resins on the metal shield layer. The metal shield layer is formed from a conductive epoxy with the use of a spray nozzle.

9 Claims, 2 Drawing Sheets

METHOD FOR FABRICATING SURFACE ACOUSTIC WAVE FILTER PACKAGE

BACKGROUND OF THE INVENTION

1. Field of the Invention

The present invention relates, in general, to a method for fabricating a surface acoustic wave (SAW) filter package and, in particular, to a method for simply fabricating a structurally stable surface acoustic wave filter package with the use of a top molding process, in which a metal shield layer is formed by a spray process.

2. Description of the Prior Art

Surface acoustic wave filters (hereinafter referred to as "SAW filters") are frequently used in commercial and other applications as RF and IF filters to provide frequency selectivity and other electronic functions. Because the acoustic wave in the SAW filter often propagates along or very near the surface, the SAW filter is generally very sensitive to surface conditions. Therefore, when the surface acoustic wave filter is packaged by mounting it on a substrate, a protector is provided to the lower side of the SAW filter to form an air gap for protecting the surface of the SAW filter. To secure a resistance to external effects, in particular, on a substrate is mounted the protector-attached SAW filter chip along the outer side of which a metal shield layer is provided. As a result, a SAW filter chip package is obtained.

In order to better understand the background of the present invention, a description will be given of a conventional method for fabricating the surface acoustic wave filter chip package, below.

FIGS. 1a to 1f are schematic cross sectional views illustrating stepwise conventional fabrication of a SAW filter chip package.

With reference to FIG. 1a, the SAW filter chip 3, to a lower side of which protectors 5 are attached, and a substrate 2, to an upper side of which bumps 4 for a flip chip bonding are attached, are provided.

Referring to FIG. 1b, the SAW filter chip 3 is mounted on the substrate 2, and the SAW filter chip is electrically and mechanically connected to a wiring portion of the substrate 2 by the flip chip bonding.

Turning now to FIG. 1c, underfills 6 are filled into a space between the substrate and the SAW filter chip. When underfills 6 are filled between the substrate and the SAW filter chip, an active region positioned on a lower side surface of the SAW filter chip is protected by the air gap formed by protectors 5.

Therefore, the metal shield layer should be formed above an outer wall of the SAW filter chip 3 in order to secure a reliability of the SAW filter chip by intercepting electrical effects from outside the SAW filter chip package. However, a metal layer is difficult to be uniformly formed on a whole outer wall of the SAW filter chip because of stepped side formed at side portions of the SAW filter chip 3 and the substrate 3. Accordingly, a fillet 7 is formed in order to convert the stepped sides having a steep gradient to stepped sides having a gentle gradient, as shown in FIG. 1d. The fillet 7 is composed of an insulating material, and gives the stepped side having the gentle gradient to the flank of the SAW filter chip 3 so that the metal layer can be easily formed on the SAW filter chip.

Referring to FIG. 1e, the metal shield layer 8 is formed on the outer wall of the SAW filter chip. At this time, at least two metal shield layers 8 should be formed. In other words, in order to secure a reliability of the SAW filter chip, an inner metal shield layer intercepting electrical effects from outside the SAW filter chip package is formed, and then an outer metal layer for preventing oxidation of the inner metal layer owing to exposure of the inner metal layer to the atmosphere is additionally formed on the inner metal layer.

Meanwhile, conventionally, the fillet should be thinly formed because a size of the fillet depends on the size of the SAW filter chip package. The thin fillet, even if formed, cannot act as a complete step-coverage around the flank of the chip, as shown in FIG. 1d. Therefore, a the metal shield layer must be deposited thickly over SAW filter chip lest any area is uncoated with the metal shield layer owing to the step.

After forming of the metal shield layer 8 is accomplished, the resulting SAW filter chip package is marked to allow its identification. That is to say, a dark color paste is coated on the metal shield layer 8 to form an identification layer 9, as shown in FIG. 1f.

As described above, according to the conventional method for fabricating the SAW filter chip package, the metal shield layer should be uniformly formed on the whole outer wall of the SAW filter chip package because the metal shield layer is formed as an outermost layer of the SAW filter chip package. Accordingly, a step of fillet forming is required for preventing a portion of the outer wall of the SAW filter chip package from being not coated owing to the stepped sides formed by the chip and the substrate. Furthermore, the metal shield layer is exposed to the atmosphere as the outermost portion of the SAW filter chip package, and secures a reliability of the SAW filter chip by intercepting electrical effects from outside the SAW filter chip package. Therefore, a further outer layer for preventing oxidation of the metal shield layer should be formed.

Accordingly, the conventional method for fabricating the SAW filter chip package has disadvantages in that the step of the fillet forming is additionally required and at least two metal shield layers having a sufficient thickness are formed on the outer wall of the SAW filter chip, and so productivity of a process for fabricating the SAW filter chip package is very poor.

There is another disadvantage of the conventional method for fabricating the SAW filter chip package in that a thin package substrate or the flank of the SAW filter chip is structurally breakable by a dropping of the SAW filter chip package or application of an external pressure.

Therefore, there continues to be a need for an improved method for simply fabricating a stable surface acoustic wave filter package.

SUMMARY OF THE INVENTION

Therefore, it is an object of the present invention to avoid disadvantages of prior arts, and to provide a method for simply fabricating a stable surface acoustic wave filter package without a step of forming of a fillet, in which a metal shield layer is formed through a spray process and a surface acoustic wave filter package is simplified in its appearance by using a top molding process.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

The present invention provides a method for fabricating a surface acoustic wave filter chip package comprising the steps of mounting the surface acoustic wave filter chip on a substrate; forming a underfill in a space between the substrate and the surface acoustic wave filter chip; forming a metal shield layer on a whole outer wall of the surface acoustic wave filter chip by spraying; and molding resins on the metal shield layer.

According to an embodiment of the present invention, the SAW filter chip is provided with plural protector structures in order to form an air gap on a lower side surface of the SAW filter chip, and mounted on the substrate by flip chip bonding.

According to a preferred embodiment of the present invention, a structurally simplified appearance of the SAW filter package, for example a rectangular parallelepiped, can be obtained by molding the SAW filter chip package with EMC (epoxy molding compound) so as to wholly cover the metal shield layer.

The present invention may be understood more readily by reference to the following detailed description of preferred embodiments of the invention and the figures.

FIGS. 2a to 2e are schematic cross sectional views illustrating stepwise fabrication of a SAW filter chip package according to the present invention.

Figure 1A:
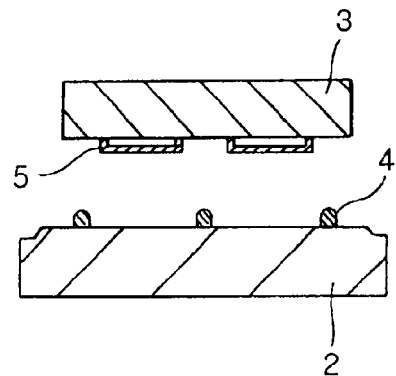
FIGS. 1a to 1f are schematic cross sectional views illustrating stepwise conventional fabrication of a SAW filter chip package.
Figure 1B:
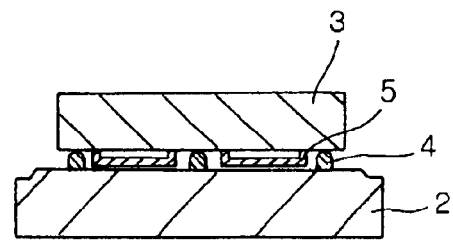
Figure 1C:
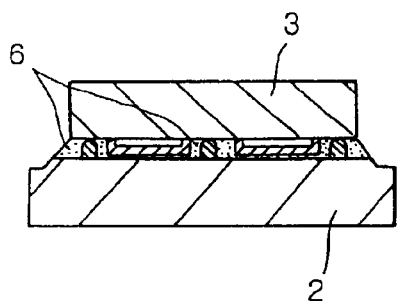
Figure 1D:
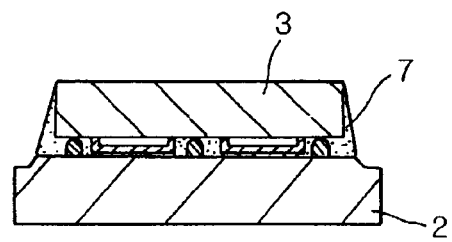
Figure 1E:
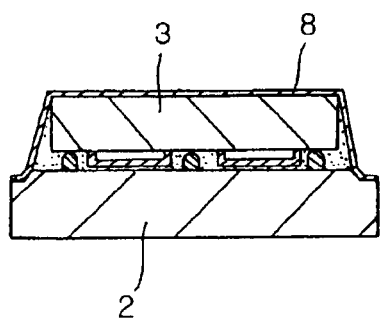
Figure 1F:
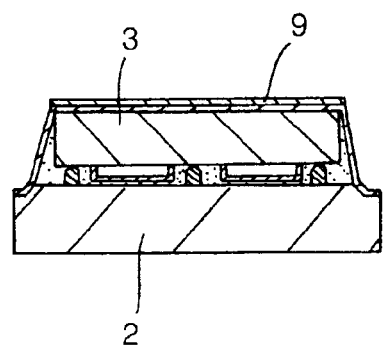
Figure 2A:
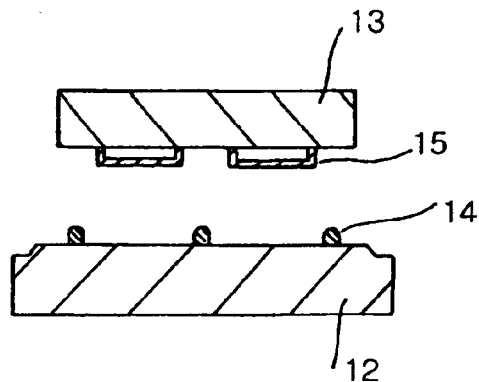
FIGS. 2a to 2e are schematic cross sectional views illustrating stepwise fabrication of a SAW filter chip package according to the present invention.

With reference to FIG. 2a, the SAW filter chip 13, to a lower side of which protectors 15 are attached, and a substrate 12, to an upper side of which bumps 14 for a flip chip bonding are attached, are provided. As described above, protectors 15 are structures forming air gaps, which protect an active area on the lower side surface of the SAW filter chip. Protectors can be easily made of dry films by those who are skilled in the art. Bumps 14 formed on the upper side surface of the substrate 12 are composed of gold, copper, aluminum, or an alloy thereof, and used to connect wiring of the substrate to the chip.

Figure 2B:
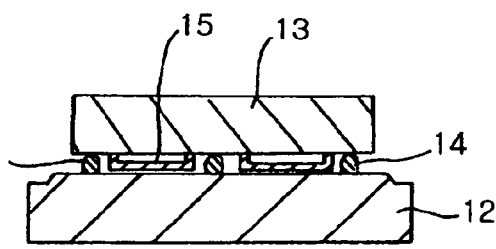

Referring to FIG. 2b, the SAW filter chip 13 is electrically connected and mechanically attached to the wiring portion of substrate 12 through bumps by flip chip bonding.

Figure 2C:
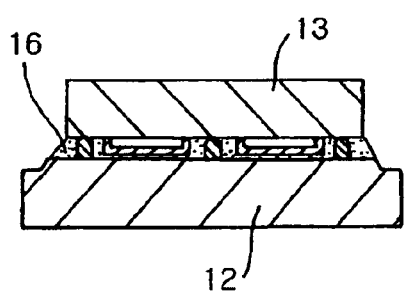

Turning now to FIG. 2c, a fluid underfill material is filled into a space between the substrate 12 and the SAW filter chip 13 and cured to form underfills 16. Underfills 16 serve to isolate the lower side of the SAW filter chip 13 from the environment and reinforce a mechanical connection of the SAW filter chip with the substrate.

Figure 2D:
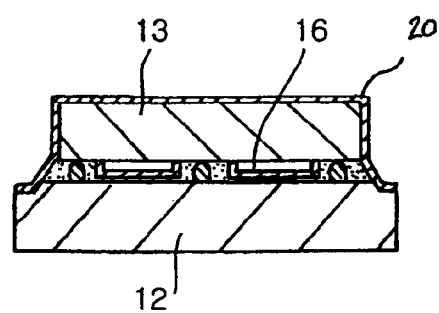

Referring to FIG. 2d, the metal shield layer 20 is formed on an outer wall of the SAW filter chip 13 mounted on the substrate 12 in order to shield an external electrical effects. Conventionally, a metal layer for protecting against oxidation of the metal shield layer and another metal layer for intercepting external electrical effects are formed on a upper side of the chip by plating. According to the present invention, however, only one metal layer 20 for excluding external electrical effects is formed by spraying.

During spraying, conductive epoxy is sprayed through a nozzle on the chip to form the metal layer. Therefore, the metal layer can be wholly formed on the outer wall of the SAW filter chip even though a stepped side is formed at a side of the chip, and also a step of forming a fillet can be omitted, thereby a method for fabricating the SAW filter chip package is simplified and a production cost can be reduced.

According to the present invention, furthermore, an additional metal layer for protecting against oxidation of the metal layer is not necessary because the metal shield layer 20 is not formed as an outermost layer but formed in order to secure the reliability of the SAW filter chip by excluding electrical effects from outside the SAW filter chip package.

Figure 2E:
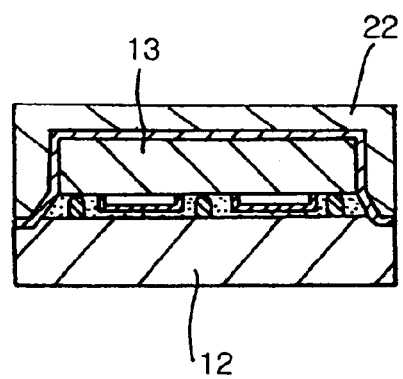

With reference to FIG. 2e, a resin molding portion 22 is formed on the whole outer wall of the chip, on which the metal shield layer 20 is formed. Whereby, the metal shield layer 20 is not exposed to the atmosphere, and so the additional metal layer for protecting against oxidation of the metal layer is not necessary.

It is preferable that the resin molding portion 22 is formed through a top molding process with the use of EMC in order to simplify and structurally stabilize the appearance of the SAW filter chip package. Thermoplastic resin, thermosetting resin, or epoxy resin is used as a resin material.

In addition, the appearance of the SAW filter chip package forms a rectangular parallelepiped by the resin molding portion 22, as shown in FIG. 2e. Accordingly, durability of the SAW filter chip package is improved by resins, as well as the SAW filter chip not being easily broken and so the SAW filter chip can be easily handled because the flank of the SAW filter chip is not exposed to the atmosphere.

The resin molding portion according to the present invention can be thinly formed in a space corresponding to the flank of the SAW filter chip, in which fillets are conventionally formed, so that the SAW filter chip package of the present invention can have the same size as that of the conventional SAW filter chip package.

In case of fabricating plural SAW filter chip packages, plural SAW filter chips are mounted on the substrate, molded with resins, and then diced to provide each SAW filter chip package.

As described above, the present invention has advantages in that a method for fabricating a surface acoustic wave filter package is simplified by removing the step of fillet forming and forming only a one-ply metal shield layer, and that a structurally stable SAW filter package can be fabricated by simplifying an appearance of the package with the use of a top molding process after the metal shield layer is formed by spraying.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. A method of fabricating a surface acoustic wave filter chip package, said method comprising the steps of:

mounting a surface acoustic wave (SAW) filter chip on a substrate;

forming an underfill in a space between the substrate and the surface acoustic wave filter chip;

overlaying a metal shield layer on a whole outer side of the surface acoustic wave filter chip by a spraying process; and molding a resin on the metal shield layer;

wherein said metal shield layer is formed by spraying a conductive epoxy on the outer side of the surface acoustic wave filter chip with the use of a spray nozzle.

2. The method according to claim 1, wherein said SAW filter chip is provided with plural protector structures in order to form an air gap on a lower side surface of the surface acoustic wave filter chip.

3. The method according to claim 1, wherein, in said molding step, an epoxy molding compound (EMC) is molded on the whole chip so as to cover said metal shield layer.

4. The method according to claim 1, wherein said surface acoustic wave filter chip is mounted on the substrate by flip chip bonding.

5. A method of fabricating a surface acoustic wave filter chip package, said method comprising the steps of:

mounting a surface acoustic wave (SAW) filter chip on a substrate;

forming an underfill in a space between the substrate and the SAW filter chip;

overlaying a shielding layer on a whole exposed outer surface of the SAW filter chip for shielding said SAW filter chip from external electrical interference; and molding a resin on the shielding layer;

wherein said shielding layer is formed by spraying a conductive epoxy on the exposed outer surface of the SAW filter chip with the use of a spray nozzle.

6. The method according to claim 5, wherein said SAW filter chip is provided with plural protector structures in order to form an air gap on a lower side surface of the SAW filter chip.

7. The method according to claim 5, wherein, in said molding step, an epoxy molding compound (EMC) is molded to cover said shielding layer.

8. The method according to claim 5, wherein said SAW filter chip is mounted on the substrate by flip chip bonding.

9. The method according to claim 5, wherein, in said molding step, an epoxy molding compound (EMC) is molded to completely cover said shielding layer.

* * * * *